United States Patent
Park (10) Patent No.: US 9,627,394 B1
(45) Date of Patent: Apr. 18, 2017

(54) NONVOLATILE MEMORY CELLS HAVING LATERAL COUPLING STRUCTURE AND MEMORY CELL ARRAYS USING THE SAME

(71) Applicant: SK hynix Inc., Gyeonggi-do (KR)

(72) Inventor: Sung Kun Park, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/990,187

(22) Filed: Jan. 7, 2016

(30) Foreign Application Priority Data

Nov. 23, 2015 (KR) .......................... 10-2015-0163847

(51) Int. Cl.
| | | |
|---|---|---|
| *H01L 27/115* | (2006.01) | |
| *H01L 29/66* | (2006.01) | |
| *H01L 27/11548* | (2017.01) | |
| *H01L 27/11524* | (2017.01) | |
| *H01L 27/11529* | (2017.01) | |

(52) U.S. Cl.
CPC .. *H01L 27/11548* (2013.01); *H01L 27/11524* (2013.01); *H01L 27/11529* (2013.01)

(58) Field of Classification Search
CPC ............. H01L 27/115; H01L 29/66825; H01L 27/11558; H01L 29/42324; H01L 27/11524; H01L 27/11517; G11C 16/0433
USPC ......... 257/E27.103, 300, 314–326, E27.078, 257/E29.3–E29.309; 438/257, 258, 241
See application file for complete search history.

(56) References Cited

U.S. PATENT DOCUMENTS

| | | | |
|---|---|---|---|
| 6,026,017 A * | 2/2000 | Wong ................. | G11C 16/0425 257/E27.103 |
| 7,977,729 B2 | 7/2011 | Watanabe et al. | |
| 2007/0183222 A1* | 8/2007 | Kanamori ............. | H01L 27/115 365/185.29 |
| 2009/0267127 A1* | 10/2009 | Chen ..................... | G11C 16/10 257/314 |
| 2013/0250700 A1* | 9/2013 | La Rosa ............... | H01L 29/788 365/185.29 |
| 2014/0293709 A1 | 10/2014 | Kwon et al. | |

FOREIGN PATENT DOCUMENTS

KR    1020070074775    7/2007

* cited by examiner

*Primary Examiner* — David Vu
*Assistant Examiner* — Jonathan Han
(74) *Attorney, Agent, or Firm* — IP & T Group LLP (57) ABSTRACT

A nonvolatile memory cell includes an active region extending in a first direction, a selection gate electrode layer intersecting the active region and extending in a second direction, a floating gate electrode layer intersecting the active region, extending in the second direction, wherein the floating gate electrode layer extends in parallel to the selection gate electrode layer and is separated from the selection gate electrode layer, and a dielectric layer disposed between the selection gate electrode layer and the floating gate electrode layer. The selection gate electrode layer, the dielectric layer, and the floating gate electrode layer are located substantially at the same level and, in combination, form a lateral coupling capacitor, and a first end portion of the floating gate electrode layer overlaps the active region.

20 Claims, 7 Drawing Sheets

NONVOLATILE MEMORY CELLS HAVING LATERAL COUPLING STRUCTURE AND MEMORY CELL ARRAYS USING THE SAME

CROSS-REFERENCE TO RELATED APPLICATION

The present application claims priority under 35 U.S.C. 119(a) to Korean Patent Application No. 10-2015-0163847, filed on Nov. 23, 2015, which is herein incorporated by reference in its entirety.

BACKGROUND

1. Technical Field

Various embodiments of the present disclosure relate to nonvolatile memory cells and memory cell arrays using the same and, more particularly, to nonvolatile memory cells having a lateral coupling structure and memory cell arrays using the same.

2. Related Art

Nonvolatile memory devices retain stored data even if their power supplies are interrupted. Various structures of the nonvolatile memory devices capable of being electrically programmed and erased have been suggested. A typical unit memory cell of nonvolatile memory devices employs a stack gate structure. This includes a gate insulation layer, which is also referred to as a tunnel insulation layer, a floating gate for storing data, an inter-gate dielectric layer, and a control gate which are sequentially stacked on a semiconductor substrate. Recently, as the size of an electronic device decreased and the semiconductor device manufacturing technology advances, various semiconductor devices that perform various functions are emerging as a key component in advanced digital products. For example, logic devices and memory devices are included in a single semiconductor chip to form a system-on-chip (SOC) device. Accordingly, a manufacturing technique has been required for an embedded nonvolatile memory device which is embedded in the SOC.

In order to manufacture the embedded nonvolatile memory device, the logic device and the nonvolatile memory device are fabricated in the same process step. A logic device such as a Metal Oxide Semiconductor (MOS) device typically employs a transistor of single gate structure. Therefore, when the nonvolatile memory device employing the stacked gate structure is formed on the same substrate with the logic devices, manufacturing processes become very complicated. In order to solve this problem, a single poly nonvolatile memory device of a single gate structure, which is a non-stacked gate structure, has been utilized more widely as the embedded nonvolatile memory device. That is, complementary metal-oxide-semiconductor (CMOS) process technologies for fabricating logic devices may be readily applied to fabrication of nonvolatile memory devices employing a single poly nonvolatile memory device.

SUMMARY

Various embodiments are directed to a nonvolatile memory device having a lateral coupling structure and a memory cell array using the same.

According to an embodiment, a nonvolatile memory cell includes an active region extending in a first direction, a selection gate electrode layer intersecting the active region and extending in a second direction, a floating gate electrode layer intersecting the active region, extending in the second direction, wherein the floating gate electrode layer extends in parallel to the selection gate electrode layer and is separated from the selection gate electrode layer, and a dielectric layer disposed between the selection gate electrode layer and the floating gate electrode layer. The selection gate electrode layer, the dielectric layer, and the floating gate electrode layer are located substantially at the same level and, in combination, form a lateral coupling capacitor, and a first end portion of the floating gate electrode layer overlaps the active region.

According to an embodiment, a nonvolatile memory cell array has cells arranged in a plurality of rows and columns. Each cell includes an active region extending in a first direction, a selection gate electrode layer intersecting the active region and extending in a second direction, a floating gate electrode layer intersecting the active region and extending in the second direction, wherein the floating gate electrode layer extends in parallel to the selection gate electrode layer and is separated from the selection gate electrode layer, and a dielectric layer disposed between the selection gate electrode layer and the floating gate electrode layer. The selection gate electrode layer, the dielectric layer, and the floating gate electrode layer are located substantially at the same level and, in combination, form a lateral coupling capacitor, and a first end portion of the floating gate electrode layer overlaps the active region.

BRIEF DESCRIPTION OF THE DRAWINGS

Various embodiments of a present disclosure will become more apparent in view of the attached drawings and accompanying detailed description, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
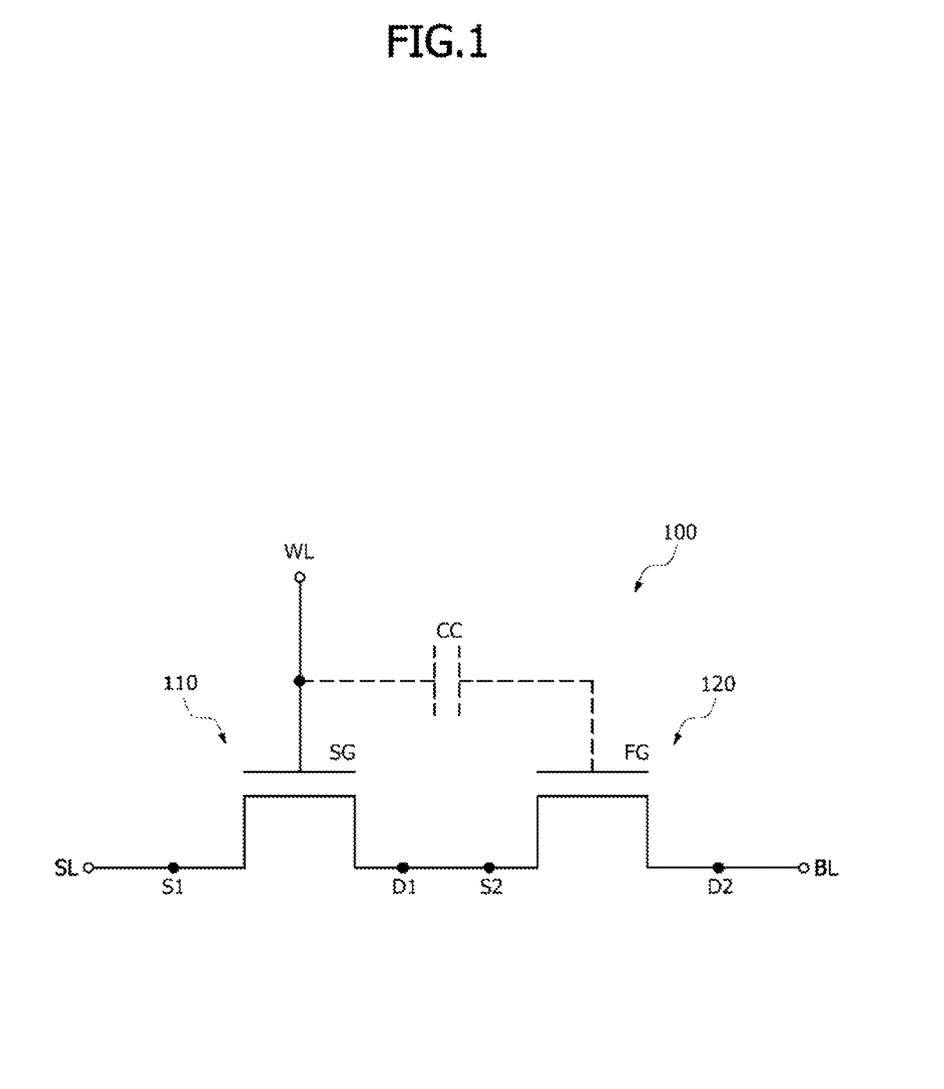
FIG. 1 is an equivalent circuit diagram of a nonvolatile memory cell according to an exemplary embodiment.

FIG. 1 is an equivalent circuit diagram of a nonvolatile memory cell 100 according to an embodiment. Referring to FIG. 1, the nonvolatile memory cell 100 includes a selection transistor 110, and a storage transistor 120 having a floating gate.

The selection transistor 110 includes a selection gate terminal SG coupled to a word line WL and a source terminal S1 coupled to a source line SL. The storage transistor 120 includes a floating gate terminal FG, and a drain terminal D2 coupled to a bit line BL. A drain terminal D1 of the selection transistor 110 and a source terminal S2 of the storage transistor 120 are coupled to each other in series. The selection gate terminal SG and the floating gate terminal FG are coupled to each other by a coupling capacitor CC.

When a bias of a predetermined value is applied to the selection gate terminal SG via the word line WL, a coupling bias of a predetermined value may be induced in the floating gate terminal FG by a coupling operation of the coupling capacitor CC. The coupling capacitor CC includes a selection gate electrode layer of the selection transistor 110, a dielectric layer, and a floating gate electrode layer of the storage transistor 120 which are sequentially disposed in the lateral direction. That is, induction of the coupling bias in the floating gate terminal FG is formed via the lateral coupling structure with the selection gate terminal SG and the dielectric layer.

Figure 2:
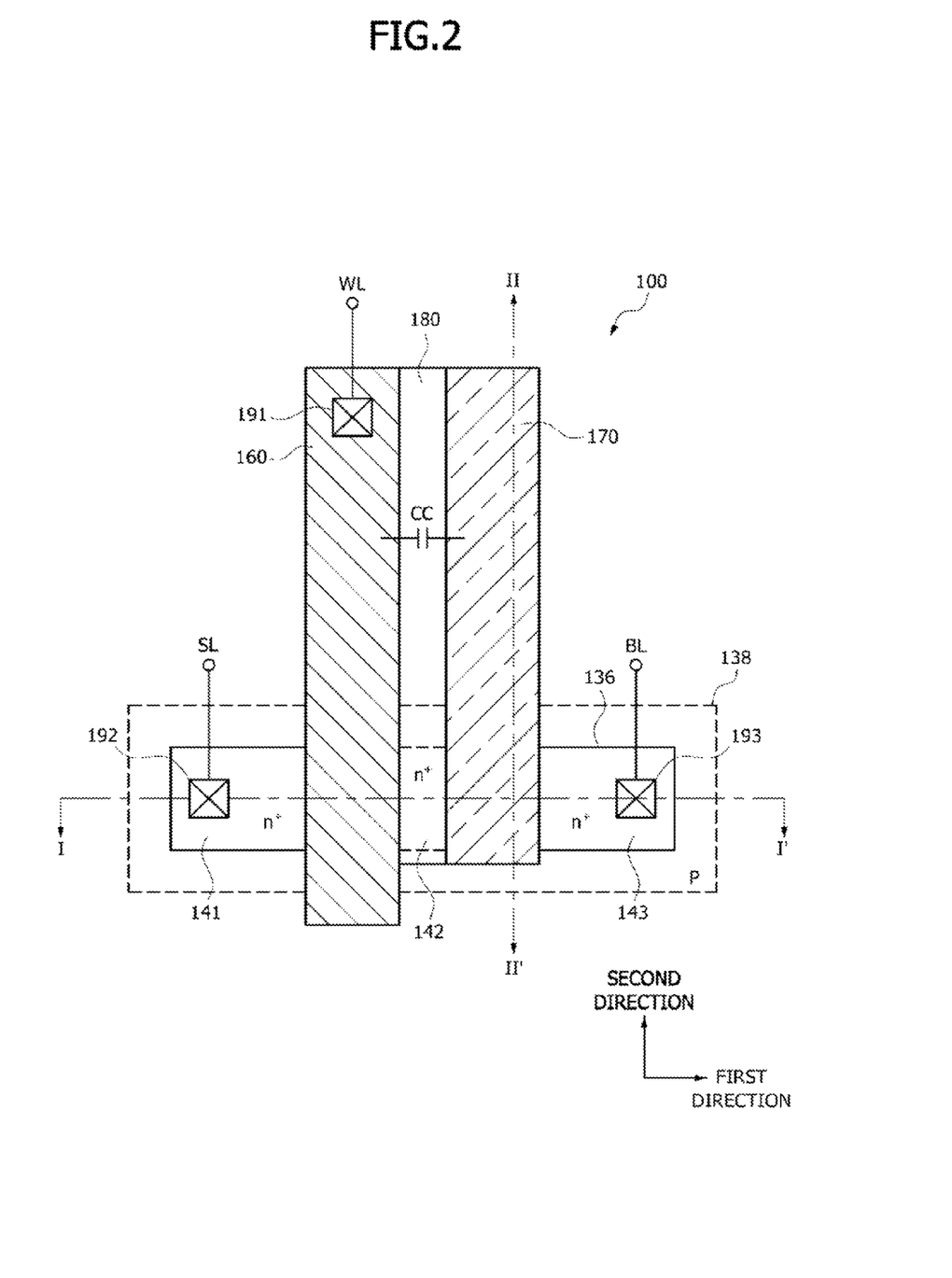
FIG. 2 is a layout diagram illustrating a nonvolatile memory cell according to an exemplary embodiment.
Figure 3:
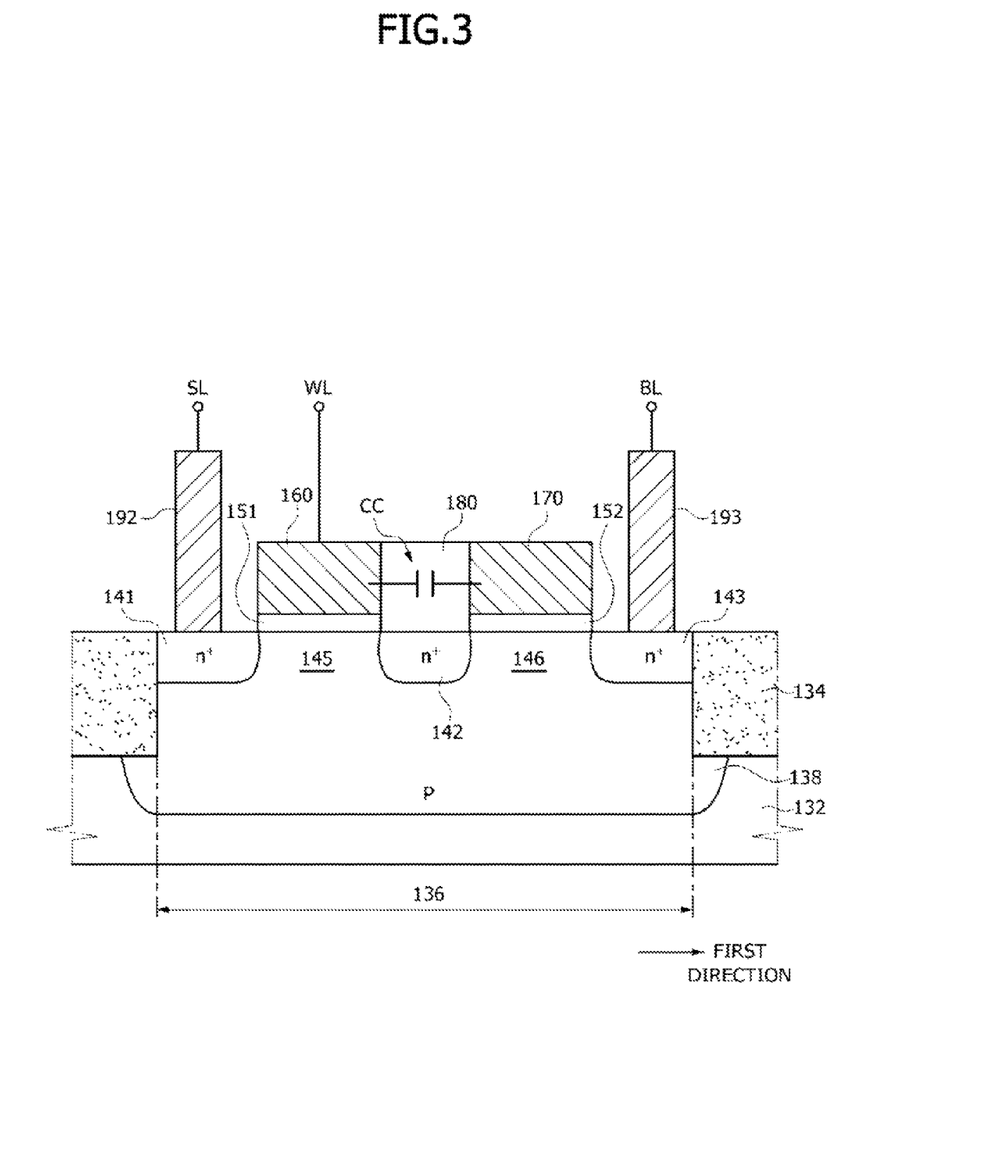
FIG. 3 is a cross-sectional view illustrating a nonvolatile memory cell taken along I-I' line of FIG. 2.

FIG. 2 is a layout diagram of an embodiment of the nonvolatile memory cell 100 having the lateral coupling structure. FIG. 3 is a cross-sectional view illustrating the nonvolatile memory cell 100 taken along I-I' line of FIG. 2.

Referring to FIGS. 2 and 3, a trench device isolation layer 134 is disposed in an upper portion of a substrate 132. An active region 136 is defined by the trench device isolation layer 134. The active region 136 has a planar stripe shape extending in a first direction. A well region 138 of a first conductivity, for example P-type, is disposed in an upper portion of the substrate 132. The P-type well region 138 is disposed to surround the active region 136. When the substrate 132 is a P-type semiconductor substrate, the P-type well region 138 may not be formed.

A first N$^+$-type junction region 141, a second N$^+$-type junction region 142, and a third N$^+$-type junction region 143 are spaced apart from each other in the upper portion of the active region 136. The first N$^+$-type junction region 141 and the third N$^+$-type junction region 143 are disposed at both edges of the active region 136. The second N$^+$-type junction region 142 is disposed between the first N$^+$-type junction region 141 and the third N$^+$-type junction region 143. The second N$^+$-type junction region 142 is spaced apart from the first N$^+$-type junction region 141 by a first channel region 145 in the first direction. The second N$^+$-type junction region 142 is spaced apart from the third N$^+$-type junction region 143 by a second channel region 146 in the first direction.

A first gate insulation layer 151 and a selection gate electrode layer 160 intersect the active region 136. That is, the first gate insulation layer 151 and the selection gate electrode layer 160 have a planar shape of a stripe shape extending in the second direction that intersects the first direction.

The first gate insulation layer 151 and the selection gate electrode layer 160 are overlapped with the first channel region 145. The first channel region 145 is disposed under the first gate insulation layer 151. Thus, the first channel region 145, the first gate insulation layer 151, and the selection gate electrode layer 160 are arranged in a vertical direction. The vertical direction is perpendicular to both of the first direction and the second direction. In an embodiment, the first gate insulation layer 151 may include an oxide layer, and the selection gate electrode layer 160 may include a polysilicon layer.

A second gate insulation layer 152 and a floating gate electrode layer 170 are spaced apart from the selection gate electrode layer 160 and intersect the active region 136. Just as the first gate insulation layer 151 and the selection gate electrode layer 160, the second gate insulation layer 152 and the floating gate electrode layer 170 have a planar shape of a stripe shape extending in the second direction that intersects the first direction. The second gate insulation layer 152 and the floating electrode layer 170 overlap the second channel region 146. The second channel region 146 is disposed below the second gate insulation layer 152. Thus, the first channel region 145, the first gate insulation layer 151, and the selection gate electrode layer 160 are arranged in a vertical direction. The vertical direction is perpendicular to both of the first direction and the second direction.

In an embodiment, the first gate insulation layer 151 may include an oxide layer. The floating gate electrode layer 170 may include a polysilicon layer and is in an isolated state without direct electrical coupling. The floating gate electrode layer 170 may be a single polysilicon layer. The distance between the selection gate electrode layer 160 and the floating gate electrode layer 170 may be substantially uniform along the second direction.

A dielectric layer 180 is disposed between the selection gate electrode layer 160 and the floating gate electrode layer 170 in the second direction. The dielectric layer 180 may be overlapped with the second N$^+$-type junction region 142. The selection gate electrode layer 160, the dielectric layer 180, and the floating gate electrode layer 170 may form the coupling capacitor CC that performs a lateral coupling operation.

The selection gate electrode layer 160 is coupled to the word line WL via a first contact 191. The first N$^+$-type junction region 141 is coupled to the source line SL via a second contact 192. The third N$^+$-type junction region 143 is coupled to the bit line BL via a third contact 193. The second N$^+$-type junction region 142 has a floating state.

The first N$^+$-type junction region 141, the second N$^+$-type junction region 142, the first channel region 145, the first gate insulation layer 151, and the selection gate electrode layer 160 form the select transistor 110 described above with reference to FIG. 1. The first N$^+$-type junction region 141 and second N$^+$-type junction region 142 correspond to the source terminal S1 of FIG. 1 and drain terminal D1 of FIG. 1 of the selection transistor 110, respectively.

The selection gate electrode layer 160 corresponds to the selection gate terminal SG of FIG. 1 of the selection transistor 110. The second N$^+$-type junction region 142, the third N$^+$-type junction region 143, the second channel region 146, the second gate insulation layer 152, and the floating gate electrode layer 170 form the storage transistor 120 described above with reference to FIG. 1. The second N$^+$-type junction region 142 and third N$^+$-type junction region 143 correspond to the source terminal S2 of FIG. 1 and drain terminal D2 of FIG. 1 of the storage transistor 120, respectively. The floating gate electrode layer 170 corresponds to the floating gate terminal FG of FIG. 1 of the storage transistor 120.

Figure 4:
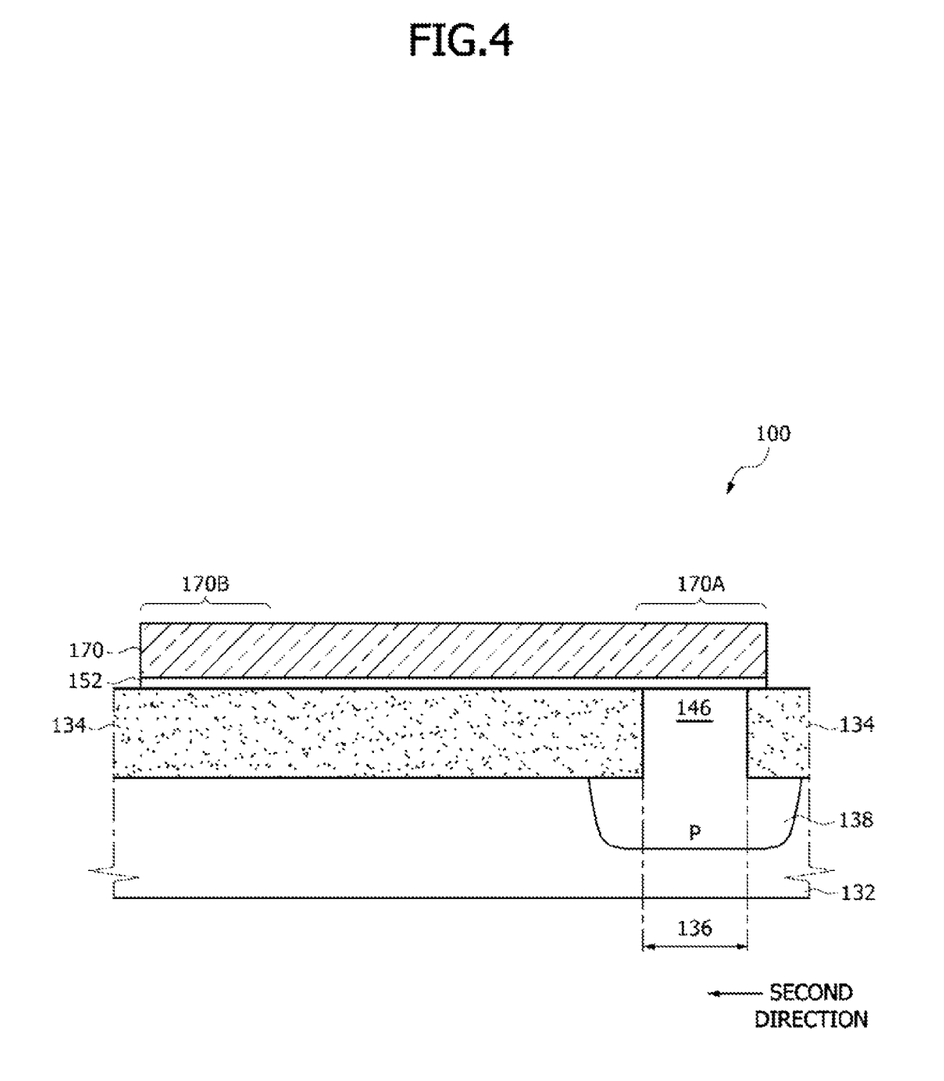
FIG. 4 is a cross-sectional view illustrating a nonvolatile memory cell taken along II-II' line of FIG. 2.

FIG. 4 is a cross-sectional view illustrating the nonvolatile memory cell 100 taken along II-II' line of FIG. 2. The same reference numerals in FIG. 4 represent the same components shown in FIGS. 2 and 3.

Referring to FIG. 4, the floating gate electrode layer 170 has a first end portion 170A and a second end portion 170B that correspond to both edges in the second direction, respectively. In an embodiment, as illustrated in the drawing, the first end portion 170A represents the right edge portion of the floating gate electrode layer 170 in the second direction, and the second end portion 170B represents the left edge portion of the floating gate electrode layer 170 in the second direction. However, in another embodiment, the first and second end portions 170A and 170B of the floating gate electrode layer 170 may be set in reverse. In the nonvolatile memory cell 100 according to the embodiment, the second channel region 146 forming the storage transistor 120 of FIG. 1 is overlapped with the first end portion 170A of the floating gate electrode layer 170.

The program operation of the nonvolatile memory cell 100 described above with reference to FIGS. 2 to 4 may be performed by a hot electron Injection method. More specifically, a positive program voltage +Vpp is applied to the word line WL, a ground voltage, for example, 0V is applied to the source line SL and the p-type well region 138, and a positive program bit line voltage +Vpbl is applied to the bit line BL. In an embodiment, the positive program voltage +Vpp may be approximately 6V to 10V, for example, about 8V. The positive program bit line voltage +Vpbl may be approximately 3V to 5V, for example, about 4V.

As the positive program voltage +Vpp is applied to the word line WL, an inversion layer is formed in the first channel region 145 and the ground voltage applied to the source line SL is transmitted to the second N$^+$-type junction region 142. In addition, a positive program coupling voltage +Vpc, which is laterally coupled to the positive program voltage +Vpp by the coupling capacitor CC, is induced in the floating gate electrode layer 170. Hot electrons are generated in the second channel region 146 adjacent to the third N$^+$-type junction region 143, as the positive program coupling voltage +Vpc is induced in the floating gate electrode layer 170, and the ground voltage and positive program bit line voltage +Vpbl are applied to the second N$^+$-type junction region 142 and third N$^+$-type junction region 143, respectively.

These hot electrons are injected into the floating gate electrode layer 170 through the second gate insulation layer 152 by the positive program coupling voltage +Vpc. As the electrons are injected into the floating gate electrode layer 170, threshold voltage of the second channel region 146 becomes higher than before the program operation.

Figure 5:
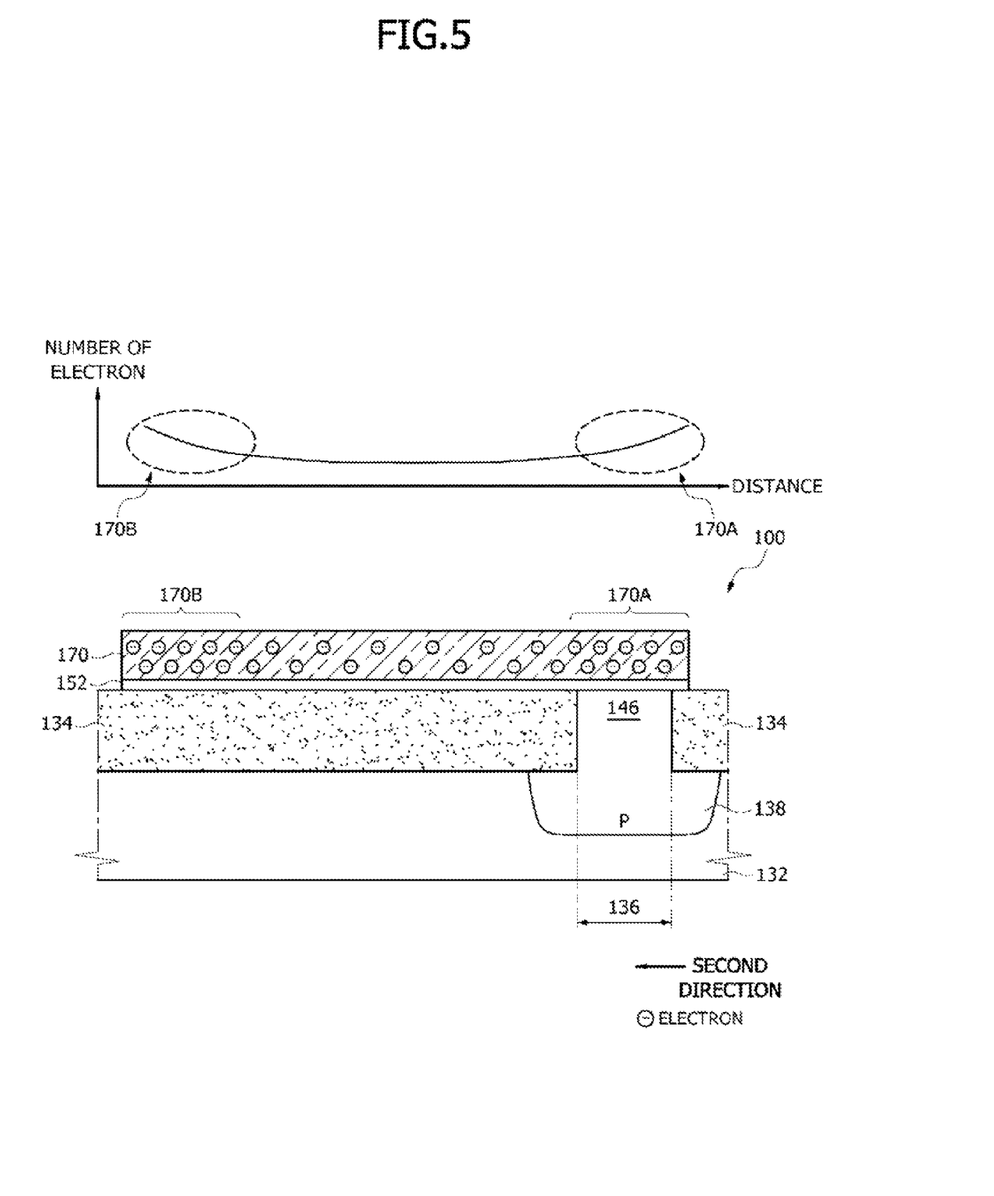
FIG. 5 is a view illustrating the distribution of electrons in a floating gate electrode layer in a program operation of a nonvolatile memory device according to an embodiment.

FIG. 5 is a view illustrating the distribution of electrons in the floating gate electrode layer 170 in the program operation of the nonvolatile memory cell 100 according to an embodiment. The cross-sectional structure shown in FIG. 5 is the same as the sectional structure shown in FIG. 4 taken along II-II' line of FIG. 2.

As illustrated in FIG. 5, electrons injected into the floating gate electrode layer 170 in the program operation are distributed in a different density in the floating gate electrode layer 170. More specifically, the electrons injected into the floating gate electrode layer 170 push each other by a repulsive force in accordance with Coulomb's law. With this phenomenon, most electrons are distributed in the first end portion 170A and the second end portion 170B in the floating gate electrode layer 170. Accordingly, when the second channel region 146 is located in the middle between the first end portion 170A and the second end portion 170B of the floating gate electrode layer 170, the number of the electrons that impact on the threshold voltage of the second channel region 146 is relatively low. However, in this embodiment, the second channel region 146 is located under the first end portion 170A of the floating gate electrode layer 170. Thus, the number of the electrons that impact on the threshold voltage of the second channel region 146 is relatively high, thereby increasing the efficiency of the program operation and reducing the voltage required in the read operation.

The erase operation of the nonvolatile memory cell 100 may be performed by a band-to-band tunneling (BTBT) method. More specifically, a negative erase voltage -Vee is applied to the word line WL, a ground voltage, for example, 0V is applied to the source line SL and p-type well region 138, and a positive erase bit line voltage +Vebl is applied to the bit line BL. In an embodiment, the negative erase voltage -Vee may be approximately -6V to -10V, for example, about -8V. The positive erase bit line voltage +Vebl may be approximately 5V to 6V, for example, about 5.5V.

As the negative erase voltage -Vee is applied to the word line WL, a negative erase coupling voltage -Vec, which is laterally coupled to the negative erase voltage -Vee by the coupling capacitor CC, is induced in the floating gate electrode layer 170. As the negative erase coupling voltage -Vec is induced in the floating gate electrode layer 170 and the positive erase bit line voltage +Vebl is applied to the third N$^+$-type junction region 143, the inversion layer is not formed in the second channel region 146 and a depletion is generated from the junction between the second channel region 146 and the third N$^+$-type junction region 143. Accordingly, energy band bending becomes greater than the energy gap. Electrons in the floating gate electrode layer 170 are tunneled to the third N$^+$-type junction region 143 through the second gate insulation layer 152. As electrons in the floating gate electrode 170 are tunneled, the threshold voltage of the second channel region 146 becomes lower than the threshold voltage of the programmed state.

Figure 6:
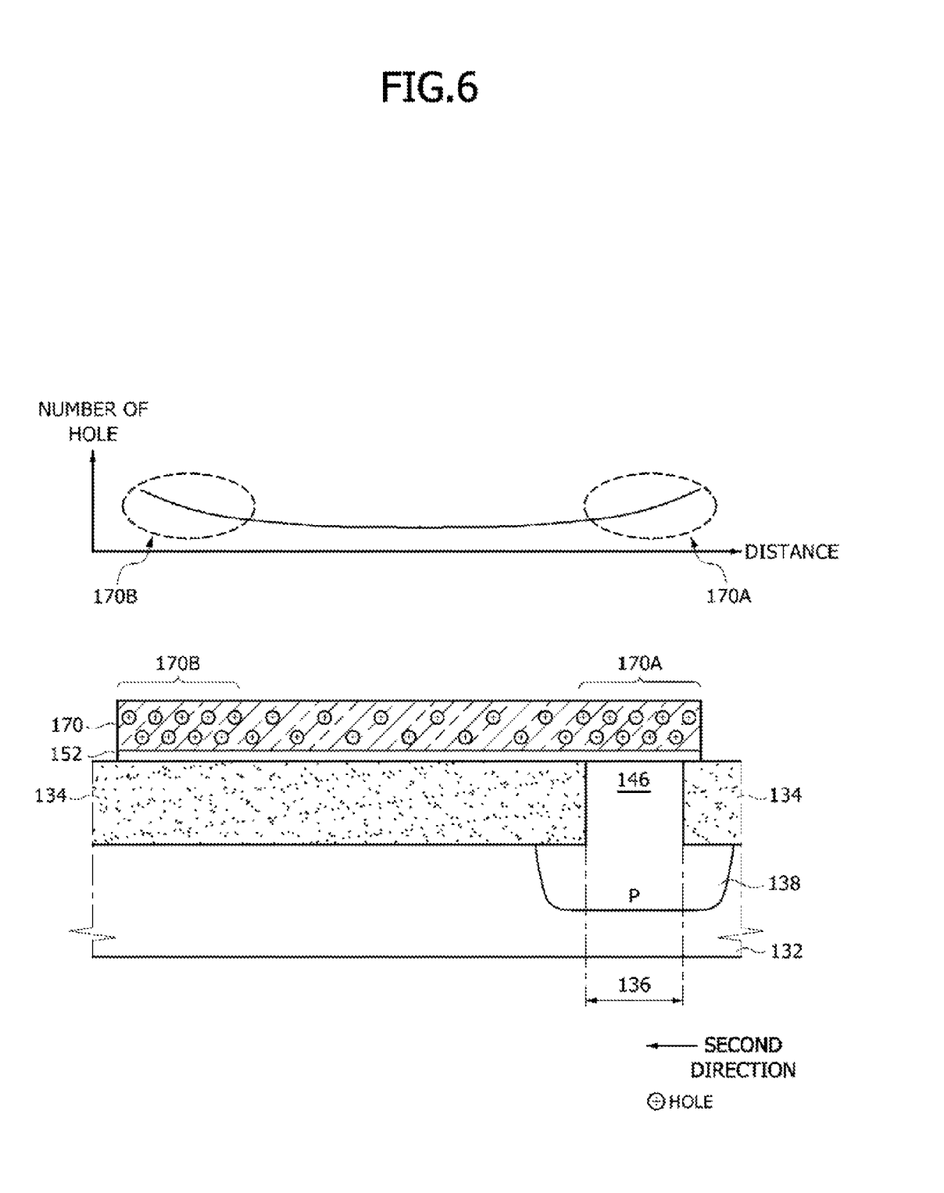
FIG. 6 is a view illustrating the distribution of electrons in a floating gate electrode layer in an erasure operation of a nonvolatile memory device according to an embodiment.

FIG. 6 is a view illustrating the distribution of holes in the floating gate electrode layer 170 by the erase operation of the nonvolatile memory cell 100. The cross-sectional structure in FIG. 6 is the same as the sectional structure shown in FIG. 4 taken along II-II' line of FIG. 2.

As illustrated in FIG. 6, it may be understood that the tunneling of electrons from the floating gate electrode layer 170 in the erase operation has the same effect as injection of holes into the floating gate electrode layer 170. The injected holes are distributed in a different density in the floating gate electrode layer 170. More specifically, holes injected into the floating gate electrode layer 170 push each other by a repulsive force in accordance with Coulomb's law. Thus, most holes are distributed in the first end portion 170A and second end portion 170B in the floating gate electrode layer 170. Accordingly, when the second channel region 146 is located in the middle between the first end portion 170A and the second end portion 170B of the floating gate electrode layer 170, the number of the holes that impact on the threshold voltage of the second channel region 146 is relatively low. However, in this embodiment, the second channel region 146 is located under the first end portion 170A of the floating gate electrode layer 170. Thus, the number of the electrons that impact on the threshold voltage of the second channel region 146 is relatively high, thereby increasing the efficiency of the erase operation and reducing the size of the voltage required in the read operation.

Figure 7:
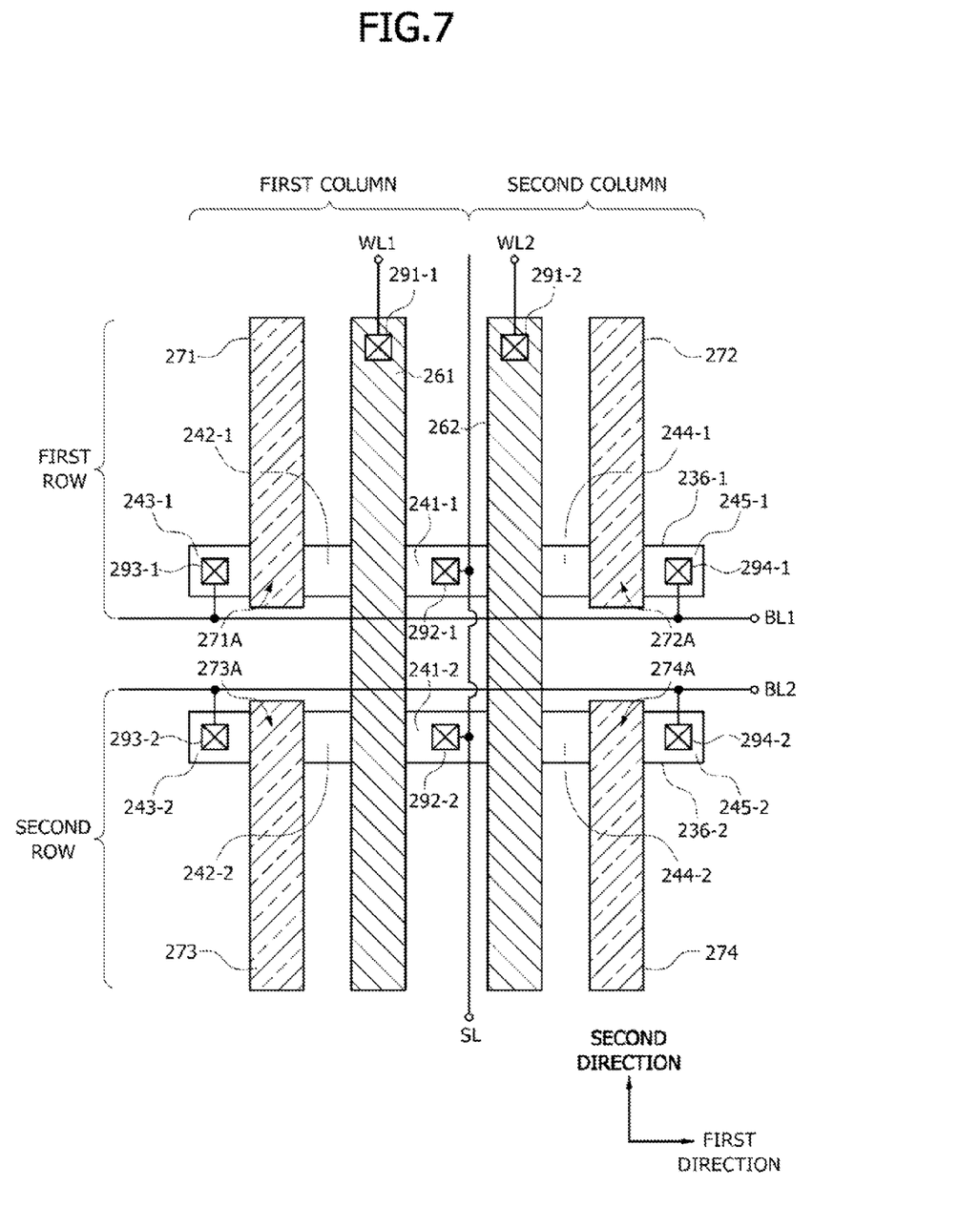
FIG. 7 is a layout diagram illustrating a nonvolatile memory cell array according to an exemplary embodiment.

FIG. 7 is a layout diagram illustrating a nonvolatile memory cell array 200 according to an embodiment. Referring to FIG. 7, the nonvolatile memory cell array 200 has a matrix shape consisting of two rows and two columns. However, it is merely an embodiment, and the nonvolatile memory cell array 200 may have a matrix shape consisting of three or more rows and columns. A first active region 236-1 and a second active region 236-2 are disposed to extend in a first direction. The first active region 236-1 and the second active region 236-2 are spaced apart from each other in a second direction intersecting the first direction.

In the first active region 236-1, cells are arranged to form a first row. In the second active region 236-2, cells are arranged to form a second row. A first selection gate electrode layer 261 and a second selection gate electrode layer 262 extend in the second direction. The first selection gate electrode layer 261 and the second selection gate electrode layer 262 are spaced apart from each other and face each other in the first direction. The first selection gate electrode layer 261 and the second selection gate electrode layer 262 intersect the first active region 236-1 and the second active region 236-2. The first selection gate electrode layer 261 is commonly coupled to the cells in a first column. The second selection gate electrode layer 262 is commonly coupled to the cells in a second column.

A first floating gate electrode layer 271 extends in the second direction and is coupled to the cell in the first row and in the first column. The first floating gate electrode layer 271 is spaced apart from the first selection gate electrode layer 261 by a predetermined distance in the first direction. A first end portion 271A of the first floating gate electrode layer 271 is overlapped with the first active region 236-1.

A second floating gate electrode layer 272 extends in the second direction and is coupled to cell in the first row and in the second column. The second floating gate electrode layer 272 is spaced apart from the second selection gate electrode layer 262 by a predetermined distance in the first direction.

A third floating gate electrode layer 273 extends in the second direction and is coupled to the cell in the second row and in the first column. The third floating gate electrode layer 273 is spaced apart from the first selection gate electrode layer 261 by a predetermined distance in the first direction. A first end portion 273A of the third floating gate electrode layer 273 is overlapped with the second active region 236-2.

A fourth floating gate electrode layer 274 extends in the second direction and is coupled to the cell in the second row and in the second column. The fourth floating gate electrode layer 274 is spaced apart from the second selection gate electrode layer 262 by a predetermined distance in the first direction. A first end portion 274A of the fourth floating gate electrode layer 274 is overlapped with the second active region 236-2.

The first active region 236-1 includes a first N$^+$-type junction region 241-1, second N$^+$-type junction regions 242-1 and 244-1, and third N$^+$-type junction regions 243-1 and 245-1. The second active region 236-2 includes a first N$^+$-type junction region 241-2, second N$^+$-type junction regions 242-2 and 244-2, and third N$^+$-type junction regions 243-2 and 245-2. The first N$^+$-type junction region 241-1 is disposed in the first active region 236-1 and between the first selection gate electrode layer 261 and the second selection gate electrode layer 262. The first N$^+$-type junction region 241-2 is disposed in the second active region 236-2 and between the first selection gate electrode layer 261 and the second selection gate electrode layer 262.

The second N$^+$-type junction region 242-1 is disposed in the first active region 236-1 and between the first selection gate electrode layer 261 and the first floating gate electrode layer 271. The second N$^+$-type junction region 244-1 is disposed in the first active region 236-1 and between the second selection gate electrode layer 262 and the second floating gate electrode layer 272. The second N$^+$-type junction region 242-2 is disposed in the second active region 236-2 and between the first selection gate electrode layer 261 and the third floating gate electrode layer 273. The second N$^+$-type junction region 244-2 is disposed in the second active region 236-2 and between the second selection gate electrode layer 262 and the fourth floating gate electrode layer 274.

The third N$^+$-type junction region 243-1 is disposed in the first active region 236-1 and adjacent to the first floating gate electrode layer 271. The third N$^+$-type junction region 245-1 is disposed in the first active region 236-1 and adjacent to the second floating gate electrode layer 272. The third N$^+$-type junction region 243-2 is disposed in the second active region 236-2 and adjacent to the third floating gate electrode layer 273. The third N$^+$-type junction region 245-2 is disposed in the second active region and adjacent to the fourth floating gate electrode layer 274.

The first selection gate electrode layer 261 is coupled to a first word line WL1 via a first contact 291-1. The second selection gate electrode layer 262 is coupled to a second word line WL2 via a second contact 291-2. The first word line WL1 is commonly coupled to the cells in the first column. The second word line WL2 is commonly coupled to the cells in the second column. The first N$^+$-type junction region 241-1 in the first active region 236-1 and the first N$^+$-type junction region 241-2 in the second active region 236-2 are commonly coupled to the source line SL via a third contact 292-1 and a fourth contact 292-2, respectively. The source line SL may be commonly coupled to the cells in the first column and the second column.

The third N$^+$-type junction regions 243-1 and 245-1 in first active region 236-1 are coupled to a first bit line BL1 via a fifth contact 293-1 and a sixth contact 294-1, respectively. The first bit line BL1 is commonly coupled to the cells in the first row. The third N$^+$-type junction regions 243-2 and 245-2 are coupled to a second bit line BL2 via a seventh contact 293-2 and the eighth contact 294-2, respectively. The second bit line BL2 may be commonly coupled to the cells in the second row.

Although it is not Illustrated in the drawings, as described above with reference to FIG. 2, a first dielectric layer (not shown in FIG. 7) may be disposed between the first selection gate electrode layer 261 and the first floating gate electrode layer 271. The first selection gate electrode layer 261, the first dielectric layer, and the first floating gate electrode layer 271, in combination, form the first coupling capacitor of lateral structure of the cells of the first row and first column.

A second dielectric layer (not shown in FIG. 7) may be disposed between the second selection gate electrode layer 262 and the second floating gate electrode layer 272. The second selection gate electrode layer 262, the second dielectric layer, and the second floating gate electrode layer 272, in combination, form a second coupling capacitor of lateral structure of the cells of the first row and second column.

A third dielectric layer (not shown in FIG. 7) may be disposed between the first selection gate electrode layer 261 and the third floating gate electrode layer 273. The first selection gate electrode layer 261, the third dielectric layer, and the third floating gate electrode layer 273, in combination, form a third coupling capacitor of lateral structure of the cells of the second row and the first column.

A fourth dielectric layer (not shown in FIG. 7) may be disposed between the second selection gate electrode layer 262 and the fourth floating gate electrode layer 274. The second selection gate electrode layer 262, the fourth dielectric layer, and the fourth floating gate electrode layer 274, in combination, form a fourth coupling capacitor of lateral structure of the cells of the second row and the second column.

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A nonvolatile memory cell comprising:
   an active region extending in a first direction;
   a selection gate electrode layer intersecting the active region and extending in a second direction;
   a floating gate electrode layer intersecting the active region, extending in the second direction, wherein the floating gate electrode layer extends in parallel to the selection gate electrode layer and is separated from the selection gate electrode layer; and
   a dielectric layer disposed between the selection gate electrode layer and the floating gate electrode layer,
   wherein the selection gate electrode layer, the dielectric layer, and the floating gate electrode layer are located substantially at the same level and, in combination, form a lateral coupling capacitor, and
   wherein a first end portion of the floating gate electrode layer overlaps the active region.

2. The nonvolatile memory cell of claim 1, further comprising:
   a first junction region disposed in a first end of the active region and adjacent to the selection gate electrode layer,
   a second junction region disposed in the active region and between the selection gate electrode layer and the floating gate electrode layer; and
   a third junction region disposed in a second end of the active region and adjacent to the floating gate electrode layer.

3. The nonvolatile memory cell of claim 2, further comprising:
   a first contact coupling the selection gate electrode layer to a word line;
   a second contact coupling the first junction region to a source line; and
   a third contact coupling the third junction region to a bit line.

4. The nonvolatile memory cell of claim 3,
   wherein the second junction region is in a floating state.

5. The nonvolatile memory cell of claim 2,
   wherein each of the first, the second, and the third junction regions has $N^+$-type conductivity.

6. The nonvolatile memory cell of claim 5, further comprising:
   a well region surrounding the active region.

7. The nonvolatile memory cell of claim 6,
   wherein the well region has P-type conductivity.

8. The nonvolatile memory cell of claim 6, further comprising:

a first channel region disposed in the well region and between the first junction region and the second junction region; and
   a second channel region disposed in the well region and between the second junction region and the third junction region.

9. The nonvolatile memory cell of claim 8,
   wherein the first end portion of the floating gate electrode layer extends over the second channel region.

10. The nonvolatile memory cell of claim 1,
    wherein a distance between the selection gate electrode layer and the floating gate electrode layer is substantially uniform along the second direction.

11. A nonvolatile memory cell array having cells arranged in a plurality of rows and columns, each cell comprising:
    an active region extending in a first direction;
    a selection gate electrode layer intersecting the active region and extending in a second direction;
    a floating gate electrode layer intersecting the active region and extending in the second direction, wherein the floating gate electrode layer extends in parallel to the selection gate electrode layer and is separated from the selection gate electrode layer; and
    a dielectric layer disposed between the selection gate electrode layer and the floating gate electrode layer,
    wherein the selection gate electrode layer, the dielectric layer, and the floating gate electrode layer are located substantially at the same level and, in combination, form a lateral coupling capacitor, and
    wherein a first end portion of the floating gate electrode layer overlaps the active region.

12. The nonvolatile memory cell array of claim 11,
    wherein the active region is coupled to the cells arranged along one of the plurality of rows.

13. The nonvolatile memory cell array of claim 11,
    wherein the selection gate electrode layer is coupled to the cells arranged along one of the plurality of columns.

14. The nonvolatile memory cell array of claim 11, further comprising:
    a first junction region disposed in the active region and adjacent to the selection gate electrode layer;
    a second junction region disposed in the active region and between the selection gate electrode layer and the floating gate electrode layer, and
    a third junction region in the active region and adjacent to the floating gate electrode layer.

15. The nonvolatile memory cell array of claim 14, further comprising:
    a first contact coupling the selection gate electrode layer to a word line;
    a second contact coupling the first junction region to a source line; and
    a third contact coupling the third junction region to a bit line.

16. The nonvolatile memory cell array of claim 15,
    wherein the second junction region is in a floating state.

17. The nonvolatile memory cell array of claim 14,
    wherein each of the first to third junction regions has $N^+$-type conductivity.

18. The nonvolatile memory cell array of claim 14, further comprising:
    a first channel region disposed in the well region and between the first junction region and the second junction region; and
    a second channel region disposed in the well region and between the second junction region and the third junction region.

19. The nonvolatile memory cell array of claim 18, wherein the first end portion of the floating gate electrode layer extends over the second channel region.

20. The nonvolatile memory cell of claim 11, wherein a distance between the selection gate electrode layer and the floating gate electrode layer is substantially uniform along the second direction.

* * * * *